(12) United States Patent
Okada et al.

(10) Patent No.: US 9,087,709 B2
(45) Date of Patent: Jul. 21, 2015

(54) SEMICONDUCTOR DEVICE

(71) Applicant: Renesas Electronics Corporation, Kawasaki-shi (JP)

(72) Inventors: Makoto Okada, Kawasaki (JP); Shuuichi Kariyazaki, Kawasaki (JP); Wataru Shiroi, Kawasaki (JP); Masafumi Suzuhara, Kawasaki (JP); Naoko Sera, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/553,835

(22) Filed: Nov. 25, 2014

(65) Prior Publication Data

US 2015/0076684 A1    Mar. 19, 2015

Related U.S. Application Data

(63) Continuation of application No. 14/093,337, filed on Nov. 29, 2013, now Pat. No. 8,922,001.

(30) Foreign Application Priority Data

Dec. 6, 2012   (JP) ................................. 2012-267653

(51) Int. Cl.
  *H01L 23/34*   (2006.01)
  *H01L 25/065*   (2006.01)
  (Continued)

(52) U.S. Cl.
  CPC ............ *H01L 25/0655* (2013.01); *H01L 23/02* (2013.01); *H01L 23/04* (2013.01);
  (Continued)

(58) Field of Classification Search
  CPC ................. H01L 2224/97; H01L 2924/15311; H01L 225/0652; H01L 25/0655; H01L 24/97; H01L 2924/19105
  USPC .......................................... 257/723, 724, 778
  See application file for complete search history.

(56) References Cited

U.S. PATENT DOCUMENTS 8,018,048 B2    9/2011  Tamaki
8,604,614 B2 *  12/2013 Kwon et al. .................. 257/737
(Continued)

FOREIGN PATENT DOCUMENTS

JP     2000-196008 A    7/2000
JP     2008-251731 A   10/2008

OTHER PUBLICATIONS

United States Notice of Allowance dated Aug. 15, 2014, in U.S. Appl. No. 14/093,337.

*Primary Examiner* — S. V. Clark
(74) *Attorney, Agent, or Firm* — McGinn IP Law Group, PLLC

(57) ABSTRACT

A semiconductor device includes a main surface, a back surface opposite to the main surface, a first side on the main surface, a second side opposite to the first side, a third side between the first side and the second side, a fourth side opposite to the third side, a first point on a periphery of the main surface between the first side and the third side, a second point on the periphery of the main surface between the second side and the fourth side, a third point on the periphery of the main surface between the first side and the fourth side, and a fourth point on the periphery of the main surface between the third side and the second side, a first semiconductor chip disposed over the main surface of the substrate, and a second semiconductor chip disposed over the main surface of the substrate.

20 Claims, 7 Drawing Sheets

(51) Int. Cl.
*H01L 23/498* (2006.01)
*H01L 23/00* (2006.01)
*H01L 23/02* (2006.01)
*H01L 23/28* (2006.01)
*H01L 23/04* (2006.01)
*H01L 23/055* (2006.01)

(52) U.S. Cl.
CPC ............. *H01L 23/28* (2013.01); *H01L 23/498* (2013.01); *H01L 23/562* (2013.01); *H01L 24/33* (2013.01); *H01L 23/055* (2013.01); *H01L 23/49816* (2013.01); *H01L 2224/16225* (2013.01); *H01L 2224/3224* (2013.01); *H01L 2224/32225* (2013.01); *H01L 2224/32245* (2013.01); *H01L 2224/73204* (2013.01); *H01L 2224/73253* (2013.01); *H01L 2224/92125* (2013.01); *H01L 2924/1015* (2013.01); *H01L 2924/15311* (2013.01); *H01L 2924/167* (2013.01); *H01L 2924/16152* (2013.01); *H01L 2924/16251* (2013.01); *H01L 2924/19041* (2013.01); *H01L 2924/19043* (2013.01); *H01L 2924/19105* (2013.01); *H01L 2924/19106* (2013.01); *H01L 2924/3511* (2013.01)

(56) References Cited

U.S. PATENT DOCUMENTS

| | | | |
|---|---|---|---|
| 2008/0237838 A1 | 10/2008 | Tamaki | |
| 2012/0001347 A1* | 1/2012 | Lee et al. | 257/777 |
| 2012/0077332 A1* | 3/2012 | Abe et al. | 438/460 |
| 2012/0133042 A1* | 5/2012 | Hayashi et al. | 257/737 |
| 2013/0034936 A1* | 2/2013 | Koduri | 438/121 |
| 2014/0077382 A1* | 3/2014 | Kwon et al. | 257/773 |
| 2014/0203451 A1* | 7/2014 | Kwon et al. | 257/774 |

* cited by examiner

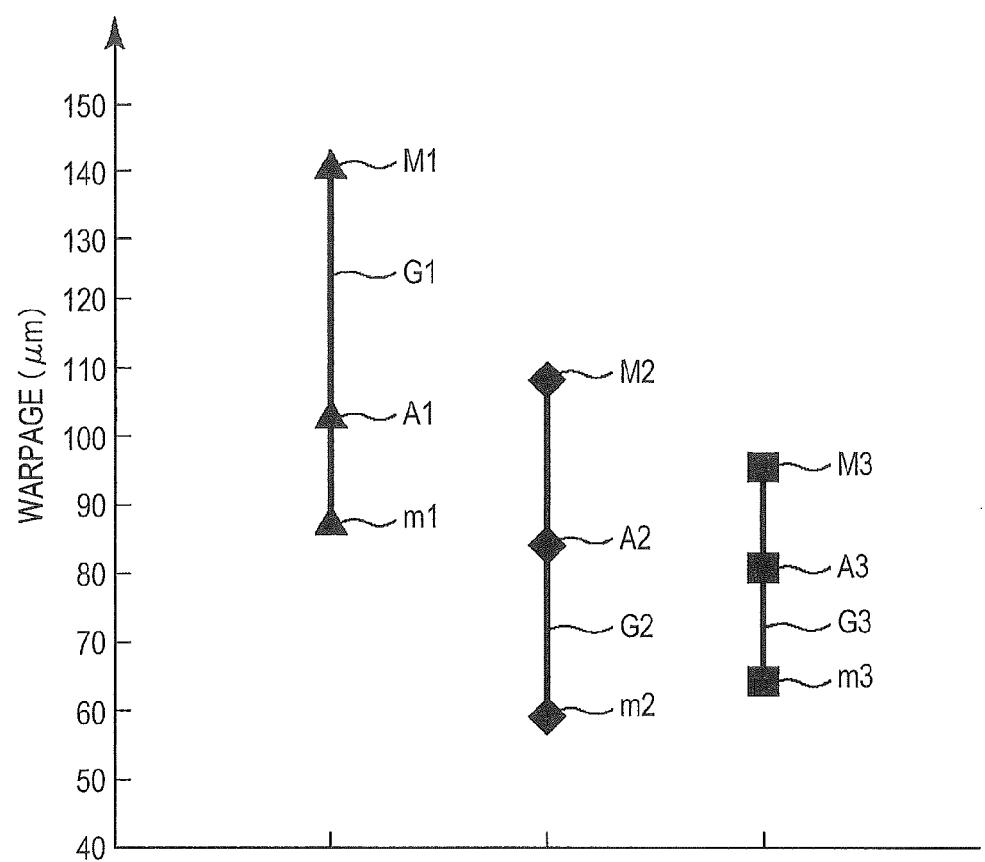

SEMICONDUCTOR DEVICE

CROSS-REFERENCE TO RELATED APPLICATIONS

The present application is a Continuation application of U.S. patent application Ser. No. 14/093,337, filed on Nov. 29, 2013, which is based on Japanese Patent Application No. 2012-267653 filed on Dec. 6, 2012, the entire contents of which are hereby incorporated by reference.

BACKGROUND

The present invention relates to semiconductor devices and more particularly to technology useful for semiconductor devices including a plurality of semiconductor chips.

To produce a semiconductor device with a plurality of semiconductor chips mounted on a substrate like an SoC (System on Chip), a larger substrate is required than when a single semiconductor chip is mounted on a substrate. However, increasing the thickness of the substrate depending on the area of the substrate brings disadvantages in the process of making through holes.

On the other hand, if the area of the substrate is increased without an increase in its thickness, warpage or deformation is likely to occur in the semiconductor device. One reason for such warpage or deformation lies in the heating or cooling step of the semiconductor device manufacturing process. Specifically, the substrate included in the semiconductor device, semiconductor chips, resin for sealing the semiconductor chips on the substrate, and lid for covering the semiconductor chips have different thermal expansion coefficients, so deformation may occur during heating or cooling.

If warpage or deformation occurs in the semiconductor device, it may be difficult or impossible to mount the semiconductor device on the wiring substrate. Particularly, if the semiconductor device is mounted through a ball grid array (BGA) provided on the back surface of the semiconductor device, some of the solder balls of the BGA might fail to reach the wiring board due to warpage or deformation.

Japanese Unexamined Patent Publication No. 2000-196008 discloses a multichip semiconductor device. In this multichip semiconductor device, three or more semiconductor chips are disposed over one surface of a quadrangular substrate with a conductor layer in a planar manner and electrically coupled to the conductor layer. In this multichip semiconductor device, a ball grid array including a plurality of electrodes for coupling the conductor layer to the outside electrically is formed over the other surface of the substrate. In this multichip semiconductor device, at least one semiconductor chip lies over each of the two centerlines which couple the middle points of opposite sides of the substrate.

Japanese Unexamined Patent Publication No. 2008-251731 discloses a semiconductor device. This semiconductor device includes a plurality of semiconductor chips and a virtually rectangular circuit substrate and has an MCM package structure. In the MCM package structure, a plurality of semiconductor chips are disposed in parallel over a semiconductor chip mounting surface of the circuit substrate for mounting a plurality of semiconductor chips and the semiconductor chip mounting surface is covered by sealing resin along the outer edge of the circuit substrate to seal the semiconductor chips. The semiconductor device includes a semiconductor chip which lies across the centerline where the longitudinal-division plane bisecting the semiconductor chip mounting surface in the long-side direction intersects the transverse-division plane bisecting the semiconductor chip mounting surface in the short-side direction. In this semiconductor device, the above semiconductor chip in has a larger thickness than the other semiconductor chips mounted over the semiconductor chip mounting surface in a direction perpendicular to the semiconductor chip mounting surface.

SUMMARY

The present invention is intended to reduce warpage of a semiconductor device. The above and further objects and novel features of the invention will more fully appear from the following detailed description in this specification and the accompanying drawings.

Next, the means to solve the problem will be explained using the reference signs used in the "DETAILED DESCRIPTION" section. These reference signs are added to clarify the relation between the appended claims (description in the "WHAT IS CLAIMED IS" section) and the embodiment (description in the "DETAILED DESCRIPTION" section). These reference signs should not be used to interpret the technical scope of the invention described in the "WHAT IS CLAIMED IS" section.

According to one aspect of the invention, there is provided a semiconductor device in which two semiconductor chips (CH1, CH2) are mounted over a diagonal of a substrate (SUB) and one (CH1) of the semiconductor chips lies over the intersection of the two diagonals of the substrate.

According to the invention, warpage of the semiconductor device is reduced.

BRIEF DESCRIPTION OF THE DRAWINGS

FIG. 7 is a graph of comparison between the semiconductor device according to the embodiment and the semiconductor device in the related art.

DETAILED DESCRIPTION

Next, the preferred embodiment of the present invent ion will be described referring to the accompanying drawings.

First Embodiment

Figure 1A:
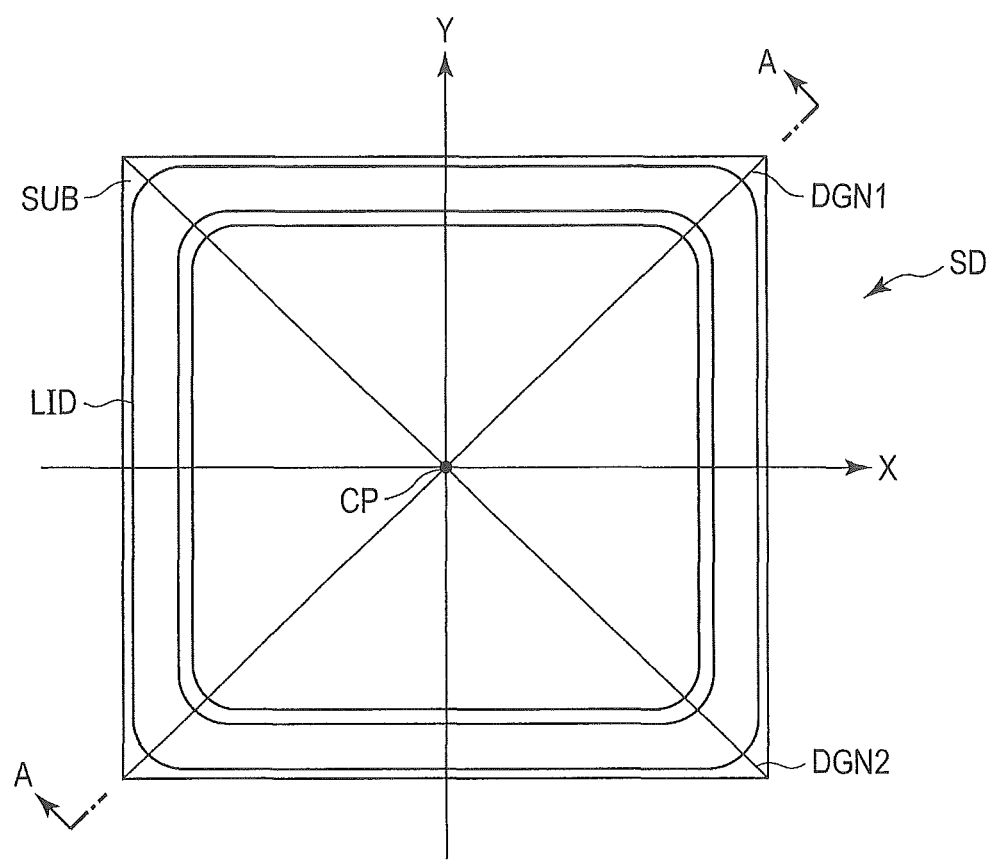
FIG. 1A is a plan view showing the structure of a semiconductor device according to an embodiment of the invention.
Figure 1B:
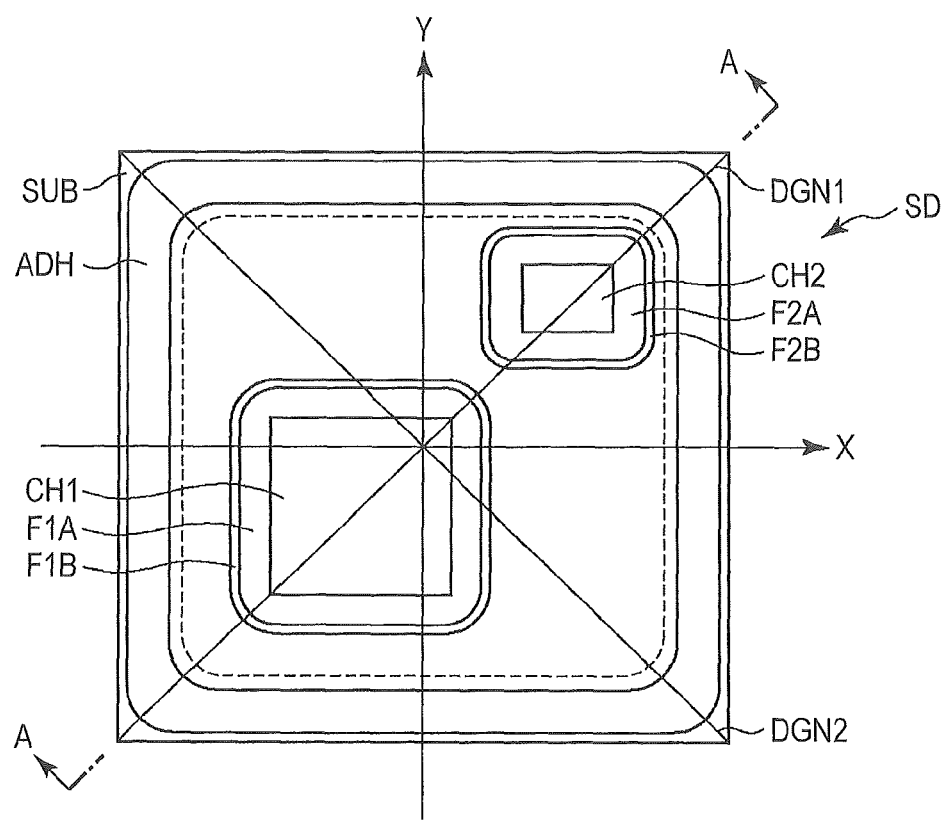
FIG. 1B is a plan view showing the structure of the semiconductor according to the embodiment except a lid.

FIG. 1A is a plan view showing the structure of a semiconductor device SD according to an embodiment of the invention. FIG. 1B is a plan view showing the structure of the semiconductor according to the embodiment except a lid. The constituent elements of the semiconductor device SD shown in FIGS. 1A and 1B are described below.

The semiconductor device SD according to the embodiment shown in FIGS. 1A and 1B includes a substrate SUB, first semiconductor chip CH1, second semiconductor chip CH2, heat dissipation resin HD, underfill UF, and lid LID.

In comparison in area between the first and second semiconductor chips CH1 and CH2, the first semiconductor chip CH1 is larger and the second semiconductor chip CH2 is smaller in a plan view. In this embodiment, the first semiconductor chip CH1 is thicker than the second semiconductor chip CH2 in a sectional view but the invention does not exclude a case that the thickness of the first semiconductor chip CH1 is not larger than that of the semiconductor chip CH2. The lid LID is of the hat type which is less susceptible to warpage or deformation than the flat type. In order to increase the deformation resistance, it is preferable that the lid LID be made of metal.

Figure 2:
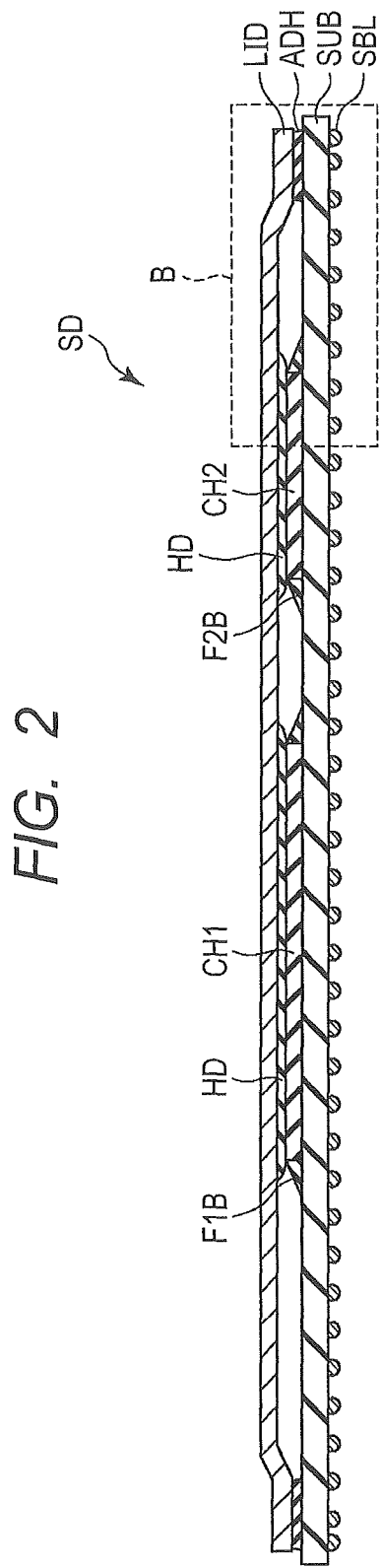
FIG. 2 is a sectional view taken along the line A-A of FIGS. 1A and 1B, showing the structure of the semiconductor device according to the embodiment.
Figure 3:
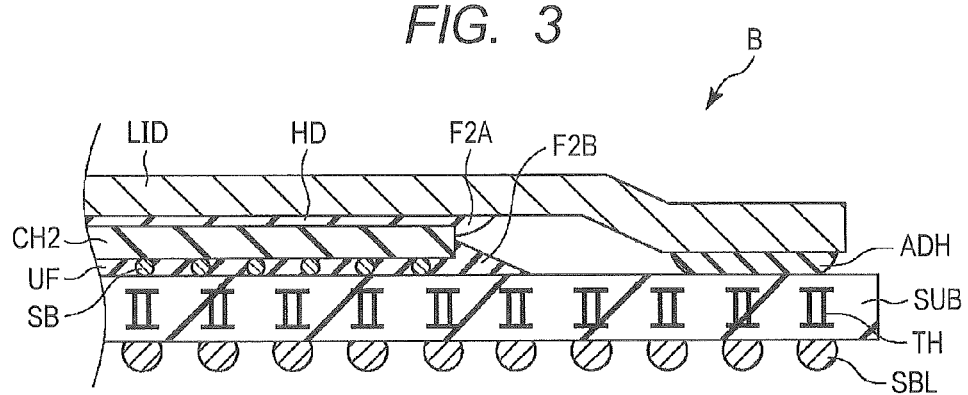
FIG. 3 is an enlarged sectional view of an area B shown in FIGS. 1A and 1B, showing the structure of the semiconductor device according to the embodiment.

FIG. 2 is a sectional view taken along the line A-A of FIGS. 1A and 1B, showing the structure of the semiconductor device SD according to the embodiment. The line A-A coincides with the first diagonal DGN1 of the semiconductor device SD. FIG. 3 is an enlarged sectional view of an area B shown in FIG. 2, showing the structure of the semiconductor device according to the embodiment. The constituent elements of the semiconductor device SD shown in FIGS. 2 and 3 are described below.

The semiconductor device SD according to the embodiment shown in FIGS. 2 and 3 includes a lid LID, heat dissipation resin HD, first semiconductor chip CH1, second semiconductor chip CH2, underfill UF and substrate SUB. The substrate SUB includes a plurality of through holes TH, solder balls SBL and a plurality of conductor layers and insulating layers (not shown). The second semiconductor chip CH2 includes solder bumps SB. The structure of the first semiconductor chip CH1 which is not shown in FIG. 3 is the same as that of the second semiconductor chip CH2. In the heat dissipation resin HD, a part which protrudes from the area just above the first semiconductor chip CH1 is called fillet F1A, and a part which protrudes from the area just above the second semiconductor chip CH2 is called fillet F2A. Similarly, in the underfill UF, a part which protrudes from the area just below the first semiconductor chip CH1 is called fillet F1B, and a part which protrudes from the area just below the second semiconductor chip CH2 is called fillet F2B.

Next, the coupling relation among the constituent elements of the semiconductor device SD according to the embodiment shown in FIGS. 1A to 3 will be explained. The first semiconductor chip CH1 and second semiconductor chip CH2 are mounted over the front surface of the substrate SUB through solder bumps SB. In other words, the first and second semiconductor chips CH1 and CH2 are flip-chip mounted over the substrate SUB. Specifically, the first and second semiconductor chips CH1 and CH2 each have a plurality of first electrodes formed as solder bumps on their first surface or first main surface. Also, a plurality of second electrodes (not shown) located in a way to correspond to the first electrodes are formed over the front surface of the substrate SUB as its main surface. For flip-chip mounting of the first and second semiconductor chips CH1 and CH2 over the front surface of the substrate SUB, the first and second semiconductor chips CH1 and CH2 are turned back, namely the first electrodes and the second electrodes are coupled in a way to correspond to each other with the front surfaces of the first and second semiconductor chips CH1 and CH2 facing the front surface of the substrate SB. Therefore, the back surfaces of the first and second semiconductor chips CH1 and CH2 are shown in FIG. 1B, etc. as their second or second main surfaces opposite to their front surfaces. The substrate SB is firmly fixed with the first and second semiconductor chips CH1 and CH2 through the resin called underfill UF which is filled in the gaps of the solder bumps SB. The first and second semiconductor chips CH1 and CH2 are mounted over the front surface of the substrate SUB without overlapping each other. In other words, the first and second semiconductor chips CH1 and CH2 are located on a plane without overlapping each other in a plan view.

Various passive elements such as capacitors and resistors (not shown) may be located on the front or back surface of the substrate SUB as appropriate.

The first and second semiconductor chips CH1 and CH2 are covered by the lid LID. In this embodiment, the first semiconductor chip CH1 is a CPU (Central Processing Unit) and the second semiconductor chip CH2 is a memory and particularly the calorific value of the former is relatively high when it is in operation. For this reason, heat dissipation resin HD is provided between the first semiconductor chip CH1 (second semiconductor chip CH2) and the lid LID. The lid LID is bonded to the substrate SUB through adhesive ADH. However, it is preferable that the adhesive ADH be located so as to leave gaps in order to prevent the space between the substrate SUB and lid LID from being completely isolated from the outside space. The adhesive ADH may be, for example, resin.

In this embodiment, the lid LID is thicker than usual for the purpose of suppressing overall warpage of the semiconductor device SD. In this embodiment, the lid LID has almost the same thickness as the substrate SUB. More specifically, the thickness of the substrate SB in this embodiment is 1.1 mm and the thickness of the lid LID is 1.0 mm, though this is just an example. In other words, the thickness of the lid LID is smaller than the thickness of the substrate SUB by not more than 10%.

The substrate SUB includes a plurality of conductor layers (not shown), insulating layers (not shown) for insulating these conductor layers from each other, and a plurality of through holes TH for coupling the conductor layers in the thickness direction of the substrate SUB. The conductor layers include wirings (not shown) which electrically couple the solder balls SBL to the first and second semiconductor chips CH1 and CH2. The solder balls SBL are coupled to the through holes TH on the back surface of the substrate SB, respectively.

How the first and second semiconductor chips CH1 and CH2 are located over the substrate SUB is explained below. The first semiconductor chip CH1 and second semiconductor chip CH2 lie over the first diagonal DGN 1 of the substrate SUB. The first semiconductor chip CH1 also lies over the second diagonal DGN 2 of the substrate SUB. In other words, the first semiconductor chip CH1 lies over the intersection of the two diagonals DGN1 and DGN2 of the substrate SUB, namely the center point CP of the substrate SUB. More specifically, when the shape of the substrate SUB is considered as a rectangle, the first and second diagonals DGN1 and DGN2 of the substrate SUB can be geometrically defined as the two diagonals of the rectangle. The first and second diagonals DGN1 and DGN2 according to this definition need not be physically formed on the front surface of the actual substrate SUB but they may be virtual diagonals. For example, if the corners of the substrate SUB are rounded, the first and second diagonals DGN1 and DGN2 may be determined based on a rectangle obtained by extending the four sides of the substrate SUB. If the four sides of the substrate SUB are partially dented or deformed, the first and second diagonals DGN1 and DGN2 may be determined based on a rectangle obtained by ignoring such dents or deformations.

The substrate SUB and the first and second semiconductor chips CH1 and CH2 are each a rectangle having four sides and four corners and are located so that their corresponding sides are parallel to each other. Here, let's call the upper side of each of the substrate SUB and the first and second semiconductor chips CH1 and CH2 shown in FIG. 1B the first side, the lower side thereof the second side, the right-hand side thereof the third side, and the left-hand side thereof the fourth side. When the first to fourth sides are extended as necessary, the first and second sides intersect the third and fourth sides. Let's call the intersection of the first and third sides the first corner, the intersection of the second and fourth sides the second corner, the intersection of the first and fourth sides the third corner, and the intersection of the second and third sides the fourth corner. Here, in the substrate SUB, the first diagonal DGN1 couples the first corner with the second corner and the second diagonal DGN2 couples the third corner with the fourth corner. In this embodiment, the first semiconductor chip CH1 which requires the largest mounting area and the second semiconductor chip CH2 which requires the next largest mounting area are arranged in a staggered manner. Specifically, in the first semiconductor chip CH1, the first corner is the nearest to the second semiconductor chip CH2 and in the second semiconductor chip CH2, the second corner is the nearest to the first semiconductor chip CH1. In this specification and appended claims, the term "rectangle" is defined as mentioned above.

In other words, any side of the first semiconductor chip CH1 does not face any side of the second semiconductor chip CH2. As described in Japanese Unexamined Patent Publication No. 2008-251731, warpage of the substrate tends to occur in a concentrated manner between two semiconductor chips (mounted thereon) of which sides face each other. This embodiment avoids such arrangement of semiconductor chips in order to prevent concentrated warpage.

Next, the arrangement of the first and second semiconductor chips CH1 and CH2 over the substrate SUB will be explained from the viewpoint of the underfill UF and adhesive ADH.

Generally there should be a given distance between two semiconductor chips each fixed with underfill. This is because it is known that if unsolidified underfill fluids contact each other, the underfill fluids move from one semiconductor chip to the other semiconductor chip. The minimum required distance between two semiconductor chips varies according to various parameters which include the distance from the substrate surface to the semiconductor chips facing each other, interval between solder bumps, and underfill fluid viscosity.

Also there should be a required minimum distance between the underfill for fixing the semiconductor chips on the substrate and the adhesive ADH for bonding the lid onto the substrate. This distance varies according to not only the parameters on which the distance between semiconductor chips depends but also adhesive viscosity, physical interference conditions related to the shapes of the semiconductor chips and lid and so on.

The second semiconductor chip CH2 meets the above requirements and is located as near to one of the four corners of the substrate SUB as possible. In addition, the first semiconductor chip CH1 is located as near to the second semiconductor chip CH2 as possible in the direction toward the same corner of the substrate SUB. This ensures that a sufficient area for mounting the second semiconductor chip CH2 is available on the substrate SUB and the position of the first semiconductor chip CH1 is as near to the center point of the substrate SUB as possible.

The positions of the first and second semiconductor chips CH1 and CH2 mounted over the substrate SUB are explained below from another viewpoint. Cartesian coordinates which have X and Y axes as shown in FIG. 1B, etc. and a center point CP or origin as the intersection of both the axes are defined on the front surface of the substrate SUB. The X axis is parallel to the first side and second side and the Y axis is parallel to the third side and fourth side. In the coordinates, the whole area of the second semiconductor chip CH2 lies in the first quadrant and the center point of the first semiconductor chip CH1 is located in the third quadrant and the first semiconductor chip CH1 covers the center point CP as the origin of the coordinates.

Next, an explanation will be given of how warpage is reduced in the whole semiconductor device SD when the first and second semiconductor chips CH1 and CH2 are positioned over the substrate SUB as mentioned above.

Figure 4:
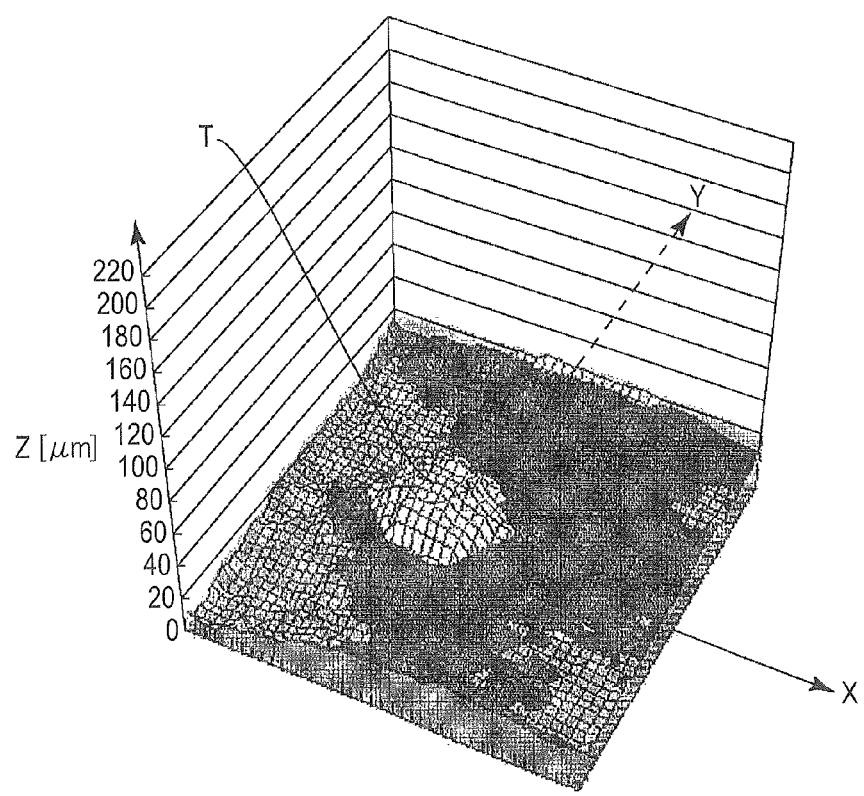
FIG. 4 is a graph showing an example of the result of measurement of warpage in the semiconductor device according to the embodiment.

FIG. 4 is a graph which shows an example of the result of measurement of warpage in the semiconductor device SD according to the embodiment. The graph of FIG. 4 is a three-dimensional contour graph, in which the X and Y axes denote the planar directions of the semiconductor device SD and the Z axis denotes the thickness direction of the semiconductor device SD. The X, Y, and Z axes shown in FIG. 4 correspond to the X, Y, and Z axes shown in FIGS. 1A and 1B respectively.

The contour graph of FIG. 4 shows distribution of warpage and deformation quantified by irradiating the back surface of the semiconductor device SD with laser light, scanning it in the X and Y directions and measuring coordinates on the Z axis.

As can be understood from the graph of FIG. 4, warpage of the semiconductor device SD spreads concentrically with apex T as the center. The apex T is located in the center of the first semiconductor chip CH1, which has the largest area among the semiconductor chips mounted over the substrate SUB, and it is known from the graph of FIG. 4 that the larger the distance from the apex T is, the larger warpage of the substrate SUB is.

Therefore, ideally the first semiconductor chip CH1 should be located in the center of the substrate SUB but in that case, an area for mounting the second semiconductor chip CH2 may not be available. For this reason, in this embodiment, after the area for mounting the second semiconductor chip CH2 is reserved, the first semiconductor chip CH1 is located in a way that its center is as near to the center of the substrate SUB as possible.

As a concrete example, the dimensions of the substrate SUB, the first semiconductor chip CH1, and the second semiconductor chip CH2 in the X and Y axis directions are approximately 40 mm, approximately 12 mm and approximately 6 mm respectively. Under these dimensional conditions, in this embodiment, the value of offset from the center point of the substrate SUB to the center point of the first semiconductor chip CH1 is as small as approximately 3 mm in each of the X and Y axis directions. In other words, in this embodiment, the first semiconductor chip CH1 lies over the center point of the substrate SUB and the center points of the first semiconductor chip CH1 and second semiconductor chip CH2 lie almost immediately over the first diagonal DGN1 of the substrate SUB. In each of the first semiconductor chip CH1 and second semiconductor chip CH2, two of the four corners lie over the first diagonal DGN1.

Furthermore, in both the X and Y axis directions, the value of offset from the center point CP of the substrate SUB to the center point of the first semiconductor chip CH1 is not more than 25% of the dimensions of the first semiconductor chip CH1 and not more than 7.5% of the dimensions of the substrate SUB.

The semiconductor device SD according to the embodiment thus manufactured successfully satisfies the requirement that the maximum amount of warpage on the Z axis should be 200 μm.

Next, an explanation will be given of a concrete example of comparison in warpage between the semiconductor device according to the embodiment and a semiconductor device in the related art.

Figure 5:
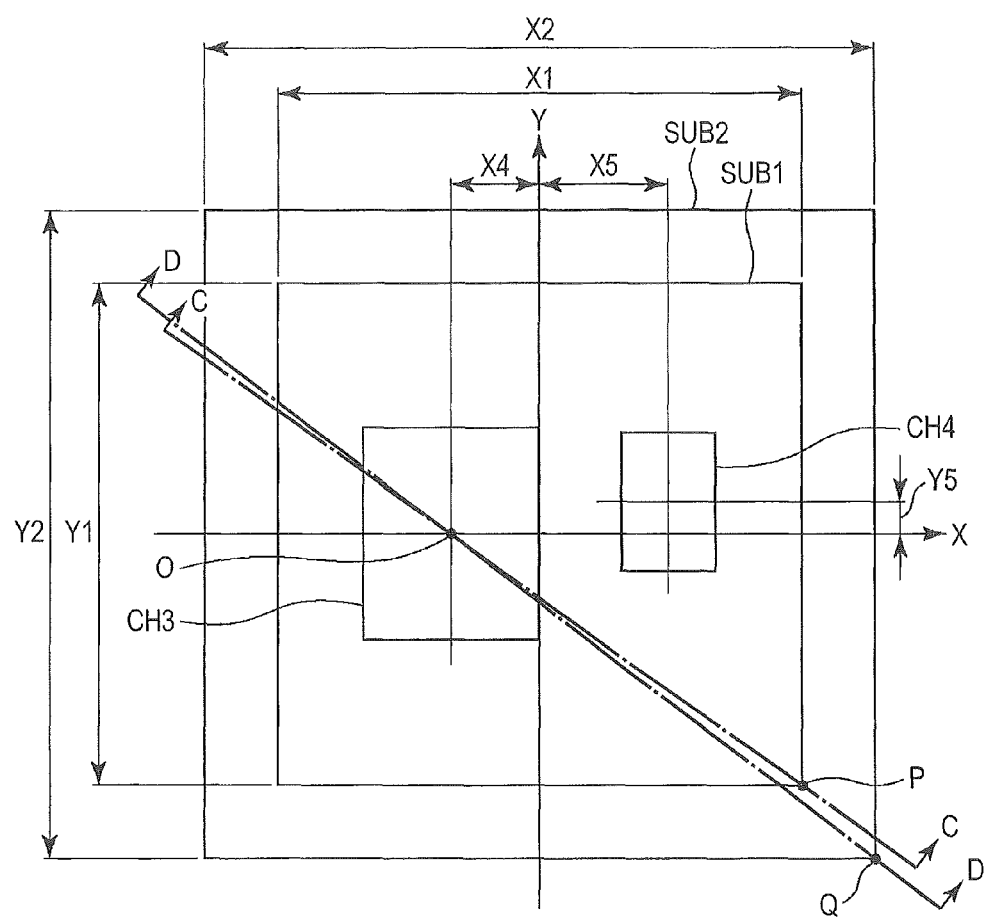
FIG. 5 is a plan view showing the structure of a semiconductor device in the related art.

FIG. 5 is a plan view showing the structure of a semiconductor device in the related art. The semiconductor device in the related art shown in FIG. 5 includes a first semiconductor chip CH3, second semiconductor chip CH4 and lid (not shown).

The constituent elements as shown in FIG. 5 are arranged as follows. The substrate SUB1 is square and its side lengths X1 and Y1 are both 31 mm. Hereinafter, the directions of the sides of the square substrate SUB1 will be called X and Y directions. The thickness of the substrate SUB1 is the same as that of the substrate SUB according to the embodiment shown in FIG. 2, etc. The thickness of the lid (not shown) is half of the thickness of the lid LID in the embodiment shown in FIG. 2, etc., namely 0.5 mm.

The first semiconductor chip CH3 is rectangular and its short side in the X direction is approximately 10 mm. Offset distance X4 of the center point of the first semiconductor chip CH3 from the center point of the substrate SUB1 is approximately 5 mm, which is half of the length (approximately 10 mm) of the short side of the first semiconductor chip CH3 in the X direction.

The second semiconductor chip CH4 is also rectangular and offset distance X5 of its center point from the center point of the substrate SUB1 in the X direction is approximately 7 mm and offset distance Y5 in the Y direction is approximately 2 mm. In the semiconductor device shown in FIG. 5, the distance of the first semiconductor chip CH3 and the distance of the second semiconductor chip CH4 from the sides of the substrate are equal in the X direction.

In the example of FIG. 5, the area occupied by the first semiconductor chip CH3 is larger than the area occupied by the second semiconductor chip CH4. However, the first semiconductor chip CH3 does not lie over the center point of the substrate SUB1. Although the first semiconductor chip CH3 and second semiconductor chip CH4 lie over one of the diagonals of the substrate SUB1, only one corner area of each chip lies over it and the arrangement conditions of this embodiment are not met.

Figure 6A:
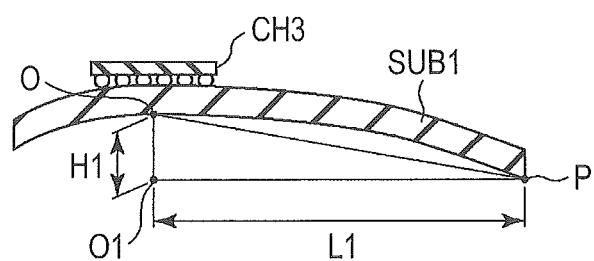
FIG. 6A is a sectional view taken along the line C-C of the semiconductor device in the related art shown in FIG. 5.

FIG. 6A is a sectional view taken along the line C-C of the semiconductor device in the related art shown in FIG. 5. The sectional view of FIG. 6A shows the substrate SUB1, the first semiconductor chip CH3 and a triangle O-O1-P indicating warpage of the substrate SUB1.

Point O represents the intersection of the perpendicular line passing through the center of the first semiconductor chip CH3 in the thickness direction and the back surface of the substrate SUB1.

Point P is the point in the substrate SUB1 which is remotest from the first semiconductor chip CH3 and second semiconductor chip CH4. In other words, point P is considered to be the remotest point from point O in the substrate SUB1 in the thickness direction of the first semiconductor chip CH3.

Point O1 is a projection of point P on the perpendicular line passing through the center of the first semiconductor chip CH3 in the thickness direction. In other words, height H1 from point O to point O1 represents the maximum amount of warpage as a criterion for evaluation of semiconductor device warpage.

As a result of actual measurement, in the semiconductor device in the related art, the maximum amount of warpage at point P was 114 μm. Also as a result of measurement of warpage at other points on the back surface of the substrate SUB1, the minimum amount of warpage was 69 μm and the average amount of warpage was 81.9 μm.

An explanation is given below of how comparison with this embodiment is made based on these results. In the semiconductor device shown in FIG. 5, only the area of the substrate SUB1 is increased to a 40 mm square, which is equal to the area of the substrate SUB according to the embodiment shown in FIG. 1B, etc. The thicknesses of the substrate SUB1 and lid, the shapes and dimensions of the first semiconductor chip CH3 and second semiconductor chip CH4, and their positional relation are unchanged. It may be said that the substrate SUB1 shown in FIG. 5 is replaced by the substrate SUB2 shown in FIG. 5.

Figure 6B:
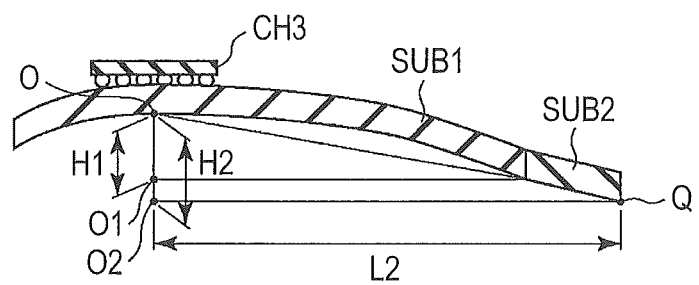
FIG. 6B is a sectional view taken along the line D-D, showing the enlarged substrate in the related art shown in FIG. 5 which has the same area as in the embodiment shown in FIG. 1B, etc.

FIG. 6B is a sectional view taken along the line D-D in FIG. 5, showing an enlarged form of the substrate in the related art shown in FIG. 5 which has the same area as in the embodiment shown in FIG. 1B, etc. The sectional view of FIG. 6B shows the substrate SUB2, the first semiconductor chip CH3 and a triangle O-O2-Q indicating warpage of the substrate SUB2.

Point O represents the intersection of the perpendicular line passing through the center of the first semiconductor chip CH3 in the thickness direction and the back surface of the substrate SUB2.

Point Q is the point in the substrate SUB12 which is remotest from the first semiconductor chip CH3. In other words, point Q is considered to be the remotest point from point O in the substrate SUB2 in the thickness direction of the first semiconductor chip CH3.

Point O2 is a projection of point Q on the perpendicular line passing through the center of the first semiconductor chip CH3 in the thickness direction. In other words, height H2 from point O to point O2 represents the distance as a criterion for evaluation of semiconductor device warpage.

Here, let's assume that the triangle O-O2-Q shown in FIG. 6B is similar to the triangle O-O1-P shown in FIG. 6A. On this assumption, the maximum amount of warpage as a criterion for evaluation of semiconductor device warpage can be estimated by calculating the distance from point O to point O2, namely height H2 of the triangle O-O2-Q.

The value of length L2 from point O2 to point Q shown in FIG. 6B is calculated in accordance with the Pythagorean theorem as follows:

$$(L2)^2 = ((X4+X2/2)^2 + (Y2/2)^2)$$

L2=approx. 32.0 mm

Similarly, the value of length L1 from point O1 to point P shown in FIG. 6A is calculated in accordance with the Pythagorean theorem as follows:

$$(L1)^2 = ((X4+X1/2)^2 + (Y1/2)^2)$$

L1=approx. 25.7 mm

Since it is assumed that the triangle O-O2-Q shown in FIG. 6B is similar to the triangle O-O1-P shown in FIG. 6A, height H2 is estimated by proportional calculation as follows:

$$H2/L2 = H1/L1$$

H2=approx. 141.9 μm

Similarly the minimum amount of warpage and the average amount of warpage among warpage at various points on the back surface of the substrate SUB2 are estimated to be 85.9 μm and 102.0 μm respectively. Since the estimated values of warpage thus calculated are obtained from the semiconductor device SUB2 equal in size to the substrate SUB according to the embodiment, they can be directly compared with the measured values of warpage of the semiconductor device according to the embodiment.

FIG. 7 is a graph of comparison between the semiconductor device according to the embodiment and the semiconductor device in the related art. FIG. 7 includes first to third graphs G1 to G3.

The first graph G1 shows the estimated amount of warpage, maximum amount M1, minimum amount m1, and average amount A1 of the semiconductor device in the related art shown in FIG. 6B. Similarly the third graph G3 shows the measured amount of warpage, maximum amount M3, minimum amount m3, and average amount A3 of the semiconductor device SD according to the embodiment shown in FIG. 1B, etc.

The second graph G2 shows the measured amount of warpage, maximum amount M2, minimum amount m2, and average amount A2 of the semiconductor device SD according to the embodiment shown in FIG. 1B, etc. when the offset from the center point of the first semiconductor chip CH1 to the center point CP of the substrate SUB is changed from 3 mm to 4 mm in both the X and Y directions As can be understood from the graph of FIG. 7, when a plurality of semiconductor chips are mounted over a substrate, the amount of semiconductor device warpage can be reduced by arranging the chips as in the embodiment. The graph also indicates that the shorter the offset distance from the center point of the substrate to the center point of the largest semiconductor device is, the more effectively the amount of semiconductor device warpage is reduced.

In the above embodiment, the semiconductor chips are flip-chip mounted over the substrate, but from the viewpoint of reducing warpage of the semiconductor device, obviously the invention is also effective in the case that semiconductor chips are mounted over a substrate by wire bonding.

The invention made by the present inventors has been so far explained concretely in reference to the preferred embodiment thereof. However, the invention is not limited thereto and it is obvious that these details may be modified in various ways without departing from the spirit and scope thereof. The various features of the embodiment as mentioned above may be combined freely without departing from the technical scope of the invention.

What is claimed is:

1. A semiconductor device comprising:
  a substrate including:
    a main surface;
    a back surface opposite to the main surface;
    a first side on the main surface;
    a second side opposite to the first side;
    a third side between the first side and the second side;
    a fourth side opposite to the third side;
    a first point on a periphery of the main surface between the first side and the third side;
    a second point on the periphery of the main surface between the second side and the fourth side;
    a third point on the periphery of the main surface between the first side and the fourth side; and
    a fourth point on the periphery of the main surface between the third side and the second side;
  a first semiconductor chip disposed over the main surface of the substrate; and
  a second semiconductor chip disposed over the main surface of the substrate,
  wherein the first semiconductor chip is disposed over an intersection between a virtual first diagonal coupling the first point with the second point over the main surface of the substrate and a virtual second diagonal coupling the third point with the fourth point over the main surface of the substrate,
  wherein the second semiconductor chip is arranged side-by-side with the first semiconductor chip, and
  wherein a dimension of the first semiconductor chip is greater than a dimension of the second semiconductor chip in plan view.

2. The semiconductor device according to claim 1, wherein the first and second semiconductor chips are disposed over the virtual first diagonal.

3. The semiconductor device according to claim 1, wherein the first semiconductor chip is disposed over the virtual first diagonal, and
  wherein the second semiconductor chip is disposed over the virtual first diagonal but not disposed over the virtual second diagonal.

4. The semiconductor device according to claim 1, wherein the substrate includes a plurality of conductor layers including wirings.

5. The semiconductor device according to claim 1, wherein a thickness of the first semiconductor chip is greater than a thickness of the second semiconductor chip in a sectional view.

6. The semiconductor device according to claim 1, further comprising a metal lid covering the first semiconductor chip and the second semiconductor chip and being bonded to the substrate,
  wherein a difference between thickness of the lid and thickness of the substrate is not more than 10% in terms of thickness ratio in a sectional view.

7. The semiconductor device according to claim 1, further comprising a lid covering the first semiconductor chip and the second semiconductor chip and being bonded to the substrate through an adhesive,
  wherein a difference between thickness of the lid and a thickness of the substrate is not more than 10% in terms of thickness ratio in a sectional view.

8. The semiconductor device according to claim 1,
  the first semiconductor chip comprising:
    a first main surface;
    a second main surface opposite to the first main surface; and
    a plurality of first electrodes located over the first main surface,
  the substrate comprising:
    a plurality of second electrodes located over the main surface,
  wherein the first electrodes and the second electrodes are coupled through a first conductor, and
  wherein the main surface and the first main surface are fixed to each other by a second resin.

9. The semiconductor device according to claim 8,
  the second semiconductor chip comprising:
    a first surface;
    a second surface opposite to the first surface; and
    a plurality of third electrodes located over the first surface,
  the substrate comprising:
    a plurality of fourth electrodes located over the main surface, wherein the third electrodes and the fourth electrodes are coupled through a second conductor, and wherein the main surface and the first surface are fixed to each other by a third resin.

10. The semiconductor device according to claim 1, wherein the substrate has a polygon shape.

11. A semiconductor device comprising:
a substrate including:
a main surface;
a back surface opposite to the main surface;
a first side on the main surface;
a second side opposite to the first side;
a third side between the first side and the second side; and
a fourth side opposite to the third side,
wherein a first vertex is where a first virtual line parallel with the first side and a third virtual line parallel with the third side intersect each other,
wherein a second vertex is where a second virtual line parallel with the second side and a fourth virtual line parallel with the fourth side intersect each other,
wherein a third vertex is where the first virtual line parallel with the first side and a fourth virtual line parallel with the fourth side intersect each other, and
wherein a fourth vertex is where a third virtual line parallel with the third side and the second virtual line parallel with the second side intersect each other,
a first semiconductor chip disposed over the main surface of the substrate; and
a second semiconductor chip disposed over the main surface of the substrate,
wherein the first semiconductor chip is disposed over an intersection between a virtual first diagonal coupling the first vertex with the second vertex over the main surface of the substrate and a virtual second diagonal coupling the third vertex with the fourth vertex over the main surface of the substrate,
wherein the second semiconductor chip is arranged side-by-side with the first semiconductor chip, and
wherein a dimension of the first semiconductor chip is greater than a dimension of the second semiconductor chip in plan view.

12. The semiconductor device according to claim 11, wherein the first and second semiconductor chips are disposed over the virtual first diagonal.

13. The semiconductor device according to claim 11, wherein the first semiconductor chip is disposed over the virtual first diagonal, and
wherein the second semiconductor chip is disposed over the virtual first diagonal but not disposed over the virtual second diagonal.

14. The semiconductor device according to claim 11, wherein the substrate includes a plurality of conductor layers including wirings.

15. The semiconductor device according to claim 11, wherein a thickness of the first semiconductor chip is greater than a thickness of the second semiconductor chip in a sectional view.

16. The semiconductor device according to claim 11, further comprising a metal lid covering the first semiconductor chip and the second semiconductor chip and being bonded to the substrate,
wherein difference between thickness of the lid and thickness of the substrate is not more than 10% in terms of thickness ratio in a sectional view.

17. A semiconductor device comprising:
a substrate including:
a main surface; and
a back surface opposite to the main surface,
wherein the main surface includes a plurality of sides;
a first semiconductor chip disposed over the main surface of the substrate; and
a second semiconductor chip disposed over the main surface of the substrate,
wherein the first semiconductor chip is disposed over an intersection between a virtual first diagonal formed across opposite sides among the plurality of sides over the main surface of the substrate and a virtual second diagonal formed across a second set of opposite sides among the plurality of sides over the main surface of the substrate,
wherein the second semiconductor chip is arranged side-by-side with the first semiconductor chip, and
wherein a dimension of the first semiconductor chip is greater than a dimension of the second semiconductor chip in plan view.

18. The semiconductor device according to claim 17, wherein the first and second semiconductor chips are disposed over the virtual first diagonal.

19. The semiconductor device according to claim 17, wherein the first semiconductor chip is disposed over the virtual first diagonal, and
wherein the second semiconductor chip is disposed over the virtual first diagonal but not disposed over the virtual second diagonal.

20. The semiconductor device according to claim 17, wherein the substrate includes a plurality of conductor layers including wirings.

* * * * *